US007679964B2

(12) United States Patent
Lee

(10) Patent No.: US 7,679,964 B2
(45) Date of Patent: *Mar. 16, 2010

(54) SEMICONDUCTOR MEMORY DEVICE CONTROLLING PROGRAM VOLTAGE ACCORDING TO THE NUMBER OF CELLS TO BE PROGRAMMED AND METHOD OF PROGRAMMING THE SAME

(75) Inventor: Seung-Won Lee, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 285 days.

This patent is subject to a terminal disclaimer.

(21) Appl. No.: 11/652,823

(22) Filed: Jan. 12, 2007

(65) Prior Publication Data

US 2007/0183205 A1 Aug. 9, 2007

(30) Foreign Application Priority Data

Feb. 3, 2006 (KR) ...................... 10-2006-0010838

(51) Int. Cl.
*G11C 16/12* (2006.01)
(52) U.S. Cl. ............................ 365/185.23; 365/185.19; 365/185.18; 365/185.33
(58) Field of Classification Search ............ 365/185.09, 365/185.19, 185.18, 185.23, 185.33
See application file for complete search history.

(56) References Cited

U.S. PATENT DOCUMENTS

| 5,530,803 | A |   | 6/1996  | Chang et al. |            |
|-----------|---|---|---------|--------------|------------|
| 5,856,946 | A | * | 1/1999  | Chan et al.  | 365/185.19 |
| 6,671,207 | B1| * | 12/2003 | Parker       | 365/185.22 |
| 6,687,159 | B2| * | 2/2004  | Pasotti et al.| 365/185.18|
| 7,477,543 | B2| * | 1/2009  | Choi         | 365/185.03 |
| 7,483,303 | B2| * | 1/2009  | Lee          | 365/185.18 |

FOREIGN PATENT DOCUMENTS

| JP | 10269787      | 10/1998 |
| JP | 2003346488    | 12/2003 |
| KR | 20040063300   | 7/2004  |
| WO | WO0219342     | 3/2002  |

OTHER PUBLICATIONS

Derwent Abstract of Publication No. JP 10-269787.*
English Abstract for Publication No. 10-269787.
English Abstract for Publication No. 2003-346488.
English Abstract for Publication No. 10-2004-0063300.

* cited by examiner

*Primary Examiner*—Andrew Q Tran
(74) *Attorney, Agent, or Firm*—F. Chau & Associates, LLC

(57) ABSTRACT

A semiconductor memory device controlling a program voltage according to the number of cells to be programmed and a method of programming the same. The semiconductor memory device includes a memory cell array. A write data buffer receives write data in a predetermined unit. A program cell counter calculates the amount of data, from the write data, to be programmed in the memory cell array. A program voltage generator outputs a program voltage to be applied to the memory cell array, in accordance with the amount of data to be programmed, at a time, in the memory cell array. The program voltage is controlled in accordance with the number of memory cells to be programmed.

16 Claims, 5 Drawing Sheets

SEMICONDUCTOR MEMORY DEVICE CONTROLLING PROGRAM VOLTAGE ACCORDING TO THE NUMBER OF CELLS TO BE PROGRAMMED AND METHOD OF PROGRAMMING THE SAME

CROSS-REFERENCE TO RELATED APPLICATIONS

This application claims priority under 35 U.S.C. § 119 to Korean Patent Application No. 10-2006-0010838 filed on Feb. 3, 2006, the entire contents of which are hereby incorporated by reference.

BACKGROUND OF THE INVENTION

1. Technical Field

The present invention relates to semiconductor memory devices and more particularly, to a semiconductor memory device controlling a program voltage according to the number of memory cells to be programmed and a method of programming the same.

2. Discussion of the Related Art

Semiconductor memory devices are storage units capable of retaining data that may be read out as needed. Semiconductor memory devices may either be volatile memory devices that lose data in the absence of power or nonvolatile memory devices that retain data even without power. Flash memory is an example of a non-volatile memory.

Flash memory may either be NAND type or NOR type. NOR flash memory is often used for code storage. For example, NOR flash memory is used in mobile telephone terminals because NOR flash memory provides fast data processing and is operable at high frequencies. NAND flash memory conducts programming and erasing operations by means of Fowler-Nordheim (F-N) tunneling. In NOR flash memory, programming operations are carried out by hot electron injection and erasing operations are carried out by F-N tunneling. NOR flash memory is differentiated into stack-gate and split-gate types in accordance with the gate structure of the memory cells.

FIG. 1 is a sectional diagram showing a stack-gate memory cell 10 of a NOR flash memory. Referring to FIG. 1, the memory cell 10 is constructed of N+ source and drain regions 13 and 14, respectively, which are formed in a P-type substrate 19. A floating gate (FG) 16 is formed over a channel region through an isolation film 15 having a thickness of less than 100 Å. A control gate (CG) 18 is formed over the floating gate 16 through an intergate insulation film, for example, an oxide-nitride-oxide (ONO) film 17. The source region 13, the drain region 14, and the control gate 18 are coupled to a source line SL, a bit line BL, and a word line WL, respectively.

During a programming operation, the source line SL and the substrate 19 are grounded. The word line WL is supplied with a word line voltage of approximately 10V and the bit line BL is supplied with a bit line voltage of approximately 5V. Under such a bias condition, electrons are injected into the floating gate 16 from the channel region adjacent to the drain region 14. This mechanism is referred to as hot electron injection, which is a feature of the NOR flash memory.

Generally, during the programming operation, when a voltage of approximately 5V is applied to the drain region 14 of the memory cell, a cell current of approximately 200 μA flows from the drain region 14 toward the source region 13 through the channel region. For example, in programming multiple bits of data, for example, bytes or words of data, at the same time, the cell current is at most approximately 1.6 mA (200 μA×8) for a byte or 3.2 mA (200 μA×16) for a word.

FIG. 2 is a sectional diagram showing a split-gate memory cell 20 of a NOR flash memory. Referring to FIG. 2, the memory cell 20 is constructed of N+ source and drain regions 23 and 24, respectively, which are formed in a P-type substrate 29. A floating gate (FG) 26 is formed over a channel region through a gate oxide film 25. A control gate (CG) 28 is formed over the floating gate 26. The gate oxide film 25 is formed through a tunnel oxide film 27. The source region 23, the drain region 24, and the control gate 28 are coupled to a source line SL, a bit line BL, and a word line WL, respectively.

Examples of bias voltages applied to the memory cell 20 for a programming operation are described herein. A source line voltage VSL of approximately 9V is applied to the source line SL. A word line voltage VWL of approximately 2V is applied to the word line WL. The bit line BL is supplied with a bit line voltage VBL of approximately 0.5V or approximately 2V in accordance with program data. Under this bias condition, electrons are injected into the floating gate 26 from the channel region adjacent to the source region 23 by hot electron injection.

In the NOR flash memory device with split-gate structure, during the programming operation, a program voltage of approximately 9V is applied to the source line SL. This program voltage is supplied from a program voltage generator that is included in the NOR flash memory device. The program voltage generator includes a regulator for generating a program voltage of a constant level. The program voltage output from the program voltage generator drops while passing through a driver and a source line selection circuit. For example, the source line voltage VSL is applied to the source line SL at a voltage lower than the program voltage output from the program voltage generator.

The drop of the source line voltage VSL becomes more problematic as the number of memory cells to be programmed at a time increases. For example, 32 memory cells may be programmed at the same time. The 32 memory cells include cells to be programmed (hereinafter, referred to as 'program cells') and cells to be inhibited in programming (hereinafter, referred to as 'program-inhibit cells'). The program cells are memory cells that are changed from an erased state to a programmed state. The program-inhibit cells are memory cells that remain in an erased state.

In the above example, the voltage drop of the source line voltage VSL is different when the number of program cells is 1 than when the number of program cells is 32. As the number of program cells increases, the source line voltage VSL becomes lower. The dropping pattern of the source line voltage VSL according to the number of program cells is shown in FIG. 6A. Such a drop of the source line voltage VSL according to the number of program cells would degrade program characteristics of the memory cells. For example, the number of program cells may affect a degree of stress that is placed upon the memory cells. Further, a large number of program cells can cause program failures due to insufficient cell currents.

SUMMARY OF THE INVENTION

The present disclosure provides a semiconductor memory device able to prevent program characteristics from degrading due to a fluctuation of program voltage levels according to the number of program cells and a method of programming the same.

One exemplary embodiment of the present invention is directed to a semiconductor memory device including a memory cell array and a program voltage generator outputting a program voltage. The program voltage is applied to the memory cell array in accordance with the number of memory cells to be programmed, at a time, in the memory cell array.

According to an exemplary embodiment, the memory cell array is programmed by means of hot electron injection. The memory cell array includes pluralities of NOR flash memory cells coupled to a source line. The plurality of NOR flash memory cells are formed in a split-gate arrangement. The program voltage is applied to the split-gate NOR flash memory cells coupled to the source line.

In another exemplary embodiment, the program voltage generator includes a regulator configured to control a level of the program voltage in accordance with the number of memory cells to be programmed. The regulator controls the level of the program voltage by means of voltage division.

Another exemplary embodiment of the present invention relates to a semiconductor memory device including a memory cell array. A write data buffer receives write data in a predetermined unit. A program cell counter calculates the amount of data, from the write data, to be programmed in the memory cell array. A program voltage generator outputs a program voltage which is to be applied to the memory cell array in accordance with the amount of data to be programmed, at a time, in the memory cell array.

According to an exemplary embodiment, the memory cell array is programmed by means of hot electron injection. The memory cell array includes pluralities of NOR flash memory cells coupled to a source line. The plurality of NOR flash memory cells are formed in a split-gate arrangement. The program voltage is applied to the split-gate NOR flash memory cells coupled to the source line.

In another exemplary embodiment, the program voltage generator includes a regulator controlling an operation of a charge pump in accordance with the amount of data to be programmed. A driver receives an output voltage from the charge pump and provides the program voltage to the memory cell array. The regulator includes a voltage divider that generates a plurality of voltage levels by means of voltage division. A selection circuit selects one of the plurality of voltage levels in accordance with the amount of data to be programmed. A comparator compares the selected voltage level with a reference voltage and generates a control signal to regulate the charge pump.

In another exemplary embodiment of the present invention, a method of programming a semiconductor memory device includes receiving write data in a predetermined unit. The amount of write data to be programmed in a memory cell array is calculated. A program voltage, which is applied to the memory cell array, is adjusted in accordance with the amount of data to be programmed.

According to an exemplary embodiment, the memory cell array is programmed by hot electron injection. The memory cell array includes a plurality of NOR flash memory cells coupled to a source line. Each of the plurality of NOR flash memory cells are formed in a split-gate type. The program voltage is applied to the source line.

BRIEF DESCRIPTION OF THE DRAWINGS

Non-limiting and non-exhaustive exemplary embodiments of the present invention are described below with reference to the following figures, wherein like reference numerals refer to like parts throughout the various figures unless otherwise specified. In the figures.

DETAILED DESCRIPTION OF EXEMPLARY EMBODIMENTS

Figure 1:
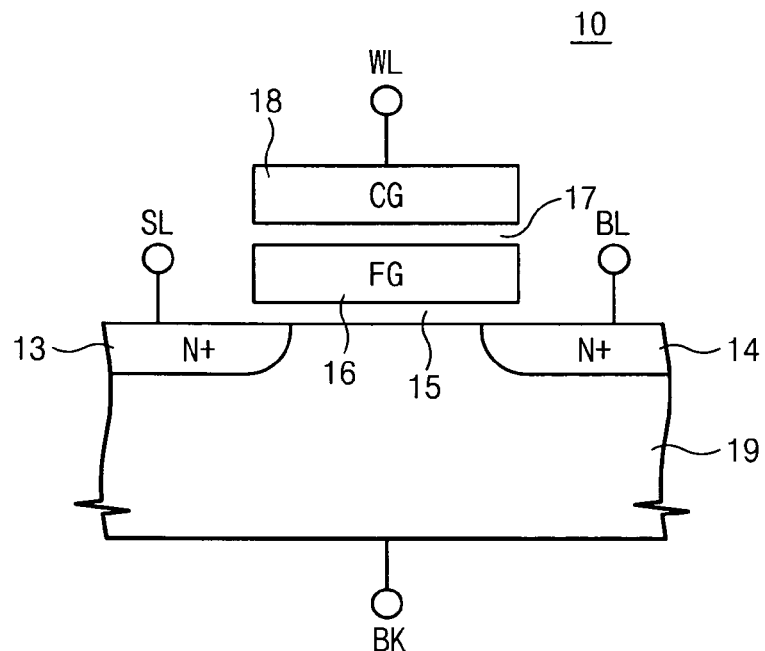
FIG. 1 is a sectional diagram showing a stack-gate memory cell of a NOR flash memory.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout the figures.

Figure 3:
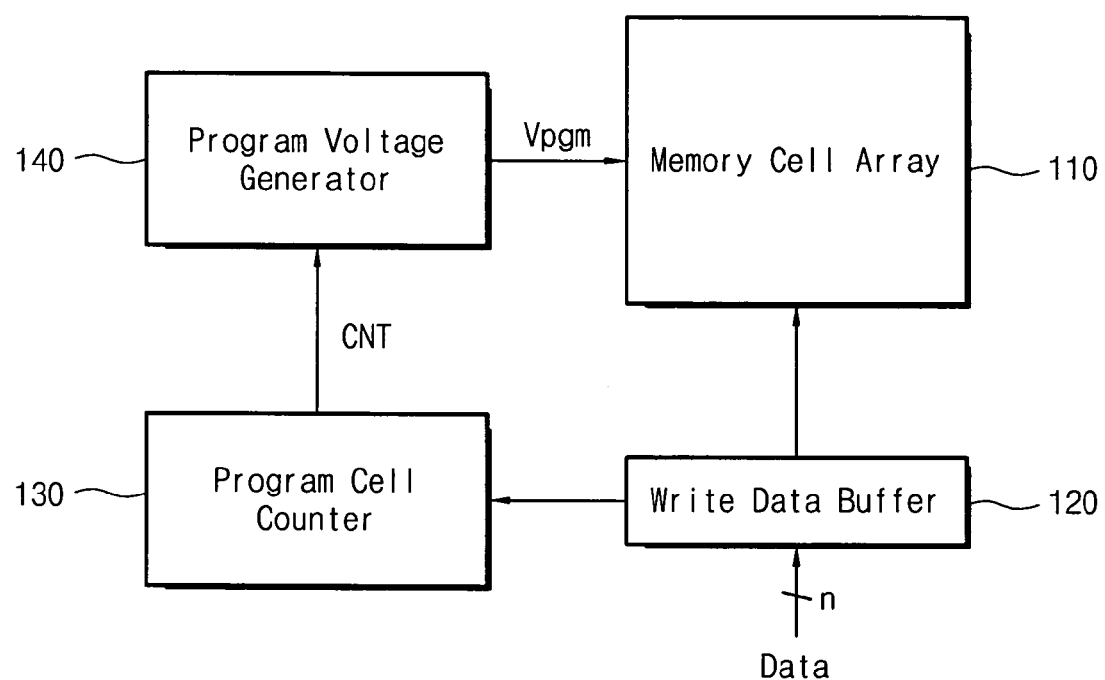
FIG. 3 is a block diagram illustrating a semiconductor memory device in accordance with an exemplary embodiment of the present invention.

FIG. 3 is a block diagram illustrating a semiconductor memory device in accordance with an exemplary embodiment of the present invention. Referring to FIG. 3, the semiconductor memory device 100 is comprised of a memory cell array 110, a write data buffer 120, a program cell counter 130, and a program voltage generator 140. The semiconductor memory device 100 is operable with variable levels of program voltage in accordance with the number of program cells.

Figure 2:
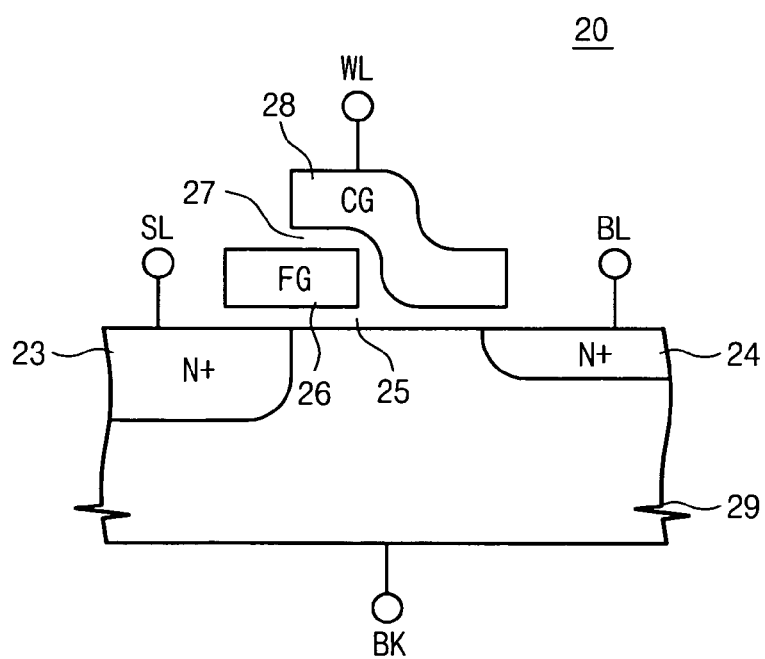
FIG. 2 is a sectional diagram showing a split-gate memory cell of a NOR flash memory.

The memory cell array 110 is formed of a plurality of memory cells (not shown). For example, the memory cell array 110 may include stack-gate NOR flash memory cells as shown in FIG. 1 or split-gate NOR flash memory cells as shown in FIG. 2. The memory cells are coupled between bit lines BL and source lines SL. The stack-gate NOR flash memory cell 10 is supplied with a program voltage of approximately 10V through the bit line BL. The split-gate NOR flash memory cell 20 is supplied with a program voltage of approximately 9V through the source line SL. Structural and operational features of the split-gate NOR flash memory will be detailed below with reference to FIG. 4.

The write data buffer 120 receives write data (e.g., data to be written or programmed) in a predetermined unit (e.g., 8, 16, or 32 bits). The write data includes data '0' or data '1'. Here, data '0' is data to be programmed (program data), while data '1' is referred to as program-inhibit data.

Usually, in NOR flash memory, memory cells of the array are erased in units of blocks. An erasing operation returns the memory cells to an unprogrammed state having data '1'. When data '0' is input into the write data buffer 120 in a programming mode, the NOR flash memory programs selected memory cells. However, when data '1' is input thereto, the NOR flash memory inhibits selected memory cells from being programmed. Accordingly, depending on whether an operation is one of programming or program-inhibition, the selected memory cells are conditioned in data '0' or '1' respectively.

The program cell counter 130 is configured to count the number of data bits, among the write data that is input to the write data buffer 120, which are to be programmed in the memory cell array 110. For example, the data to be programmed is said to be data '0'. The program cell counter 130 calculates the number of data bits '0' among the write data, and then provides a count signal CNT to the program voltage generator 140.

The program voltage generator 140 adjusts a level of the program voltage Vpgm in response to the count signal CNT provided from the program cell counter 130. The program voltage generator 140 sets the program voltage Vpgm to a higher voltage as the number of program cells increases.

Generally, in split-gate NOR flash memory, a program voltage of approximately 9V is supplied by way of the source line SL. Each source line is coupled to a plurality of split-gate-NOR flash memory cells. If the program voltage is supplied to the source line SL without regard to the number of program cells, program characteristics would fluctuate depending on the number of program cells. For example, if the number of write data bits is 32 and the number of program cells is 1, the program cell would be damaged due to stress caused by an excessively high level of program voltage. Otherwise, if the number of program cells is 32, program failures would result due to a drop of the program voltage.

The semiconductor memory device 100 shown in FIG. 3 is able to control a level of the program voltage Vpgm in accordance with the number of program cells. For example, the semiconductor memory device 100 lowers the program voltage Vpgm when the number of program cells is relatively small and raises the program voltage Vpgm when the number of program cells is relatively large. Thus, the semiconductor memory device 100 according to an exemplary embodiment of the present invention is able to adjust the program voltage Vpgm in accordance with the number of program cells, accordingly program failures due to differences of program voltage Vpgm by the number of program cells may be prevented.

Figure 4:
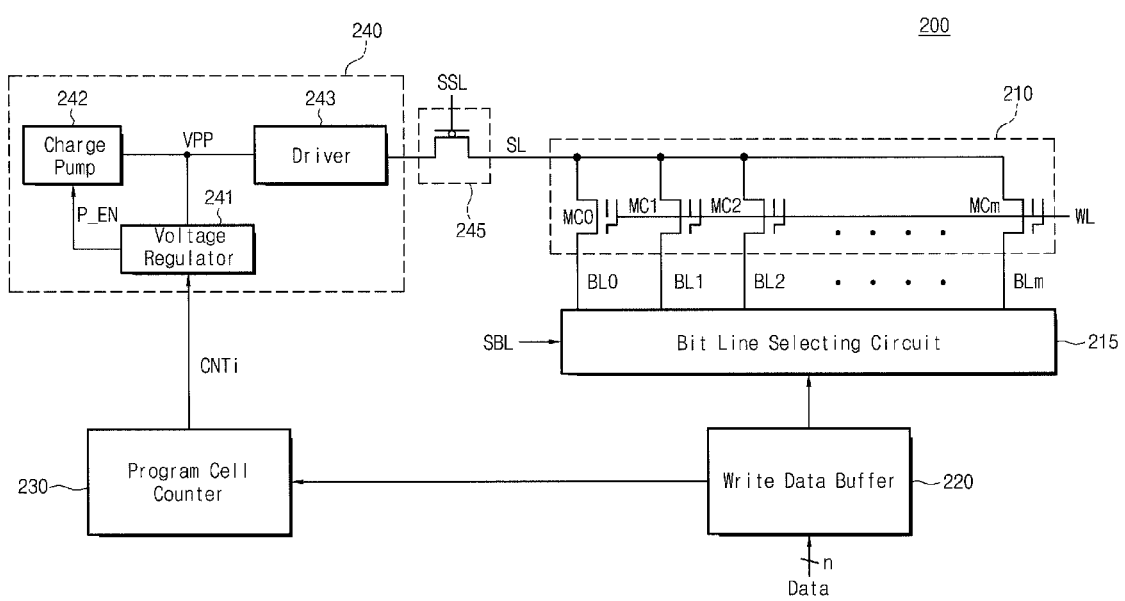
FIG. 4 is a block diagram illustrating a semiconductor memory device in accordance with an exemplary embodiment of the present invention.

FIG. 4 is a block diagram illustrating a semiconductor memory device in accordance with another exemplary embodiment of the present invention. Referring to FIG. 4, the semiconductor memory device 200 is comprised of a memory cell array 210, a bit line selection circuit 215, a write data buffer 220, a program cell counter 230, a program voltage generator 240, and a source line selection circuit 245. The semiconductor memory device 200 shown in FIG. 4 has split-gate NOR flash memory cells. The semiconductor memory device 200 is able to control the source line voltage VSL in accordance with the number of program cells.

The memory cell array 210 is formed of a plurality of memory cells MC0, MC1, MC2, . . . , MCm (MC1-MCm). Each of the plurality of memory cells are formed as split-gate NOR flash memory cells. As shown in FIG. 4, the plurality of memory cells MC0-MCm are coupled with a single word line WL or source line SL. However, it shall be understood that the memory cell array 210 includes more memory cells than are shown in the circuit pattern of FIG. 4.

The memory cells MC0-MCm are arranged in a group and are connected to a word line selection circuit (not shown) by way of the word line WL. The memory cells MC0-MCm are connected to the source line selection circuit 245 by way of the source line SL. The memory cells MC0-MCm are coupled between the source line SL and the plurality of bit lines BL0, BL1, BL2, . . . , BLm (BL1-BLm). Each memory cell is connected to the bit line selection circuit 215 through a respective bit line.

For example, the memory cell array 210 includes 512 memory cells coupled to a source line SL and a word line WL. A word line voltage and a source line voltage are applied to the 512 memory cells. For example, the word line voltage is approximately 2V and the source line voltage is approximately 9V. In a programming operation, the memory cell array 210 is programmed in a predetermined unit. For example, the 512 memory cells are programmed in units of 32 bits in 16 programming steps. During this, memory cells to be simultaneously programmed are selected by the bit line selection circuit 215.

The bit line selection circuit 215 selects program cells at the same time in response to a bit line selection signal SBL. The bit line selection signal SBL is provided from a column decoder (not shown). The bit line selection circuit 215 may be formed of NMOS (n-channel metal-oxide-semiconductor field-effect) transistors although not shown herein. The NMOS transistors are each coupled between the bit lines and the write data buffer 220. The bit line selection circuit 215 provides the write data to selected bit lines in response to the bit line selection signal SBL.

The write data buffer 220 receives the write data in the predetermined unit (e.g., 32 bits). The write data includes data '0' or '1'. Here, data '0' corresponds to data to be programmed, while data '1' corresponds to program-inhibit data. When the write data is data '0', a voltage of approximately 0.5V is applied to the selected bit lines. During this step, the memory cells corresponding thereto are programmed into data '0' from data '1'. Otherwise, when the write data is data '1', a voltage of approximately 2V is applied to the selected bit lines. Then, the memory cells corresponding thereto are set to a state of program-inhibition, maintaining data '1'.

The program cell counter 230 counts the amount of data to be programmed of the write data input to the write data buffer 220 in the memory cell array 210. The data to be programmed is data '0'. For example, the program cell counter 230 calculates the number of data '0' from the write data and then provides a count signal CNTi (where "i" is a positive integer) to the program voltage generator 240.

The program voltage generator 240 controls the source line voltage VSL which is applied to the memory cell array 210 in response to the count signal CNTi provided from the program cell counter 230. The program voltage generator 240 raises the source line voltage VSL as the number of program cells becomes larger.

Referring to FIG. 4, the program voltage generator 240 is comprised of a regulator 241, a charge pump 242, and a driver 243. The regulator 241 generates a pump enable signal P_EN, for controlling the charge pump 242 in response to the count signal CNTi provided by the program cell counter 230. The charge pump 242 is operable in response to the pump enable signal P_EN. For example, the regulator 241 controls an operation of the charge pump 242 in accordance with the number of program cells by adjusting an output voltage VPP of the charge pump 242. The structural and operational features of the regulator 241 are described below in conjunction with FIG. 5. The driver 243 receives the output voltage VPP of the charge pump 242 and generates the source line voltage VSL.

The source line selection circuit 245 is coupled between the driver 243 and the source line SL. The source line selection circuit 245 provides the source line SL with an output voltage of the driver 243 in response to a source line selection signal SSL. The source line selection circuit 245 may be formed of a PMOS (p-channel metal-oxide-semiconductor field-effect) transistor as shown in FIG. 4. The PMOS transistor electrically connects or disconnects the source line SL with the driver 243 in response to the source line selection signal SSL.

Figure 5:
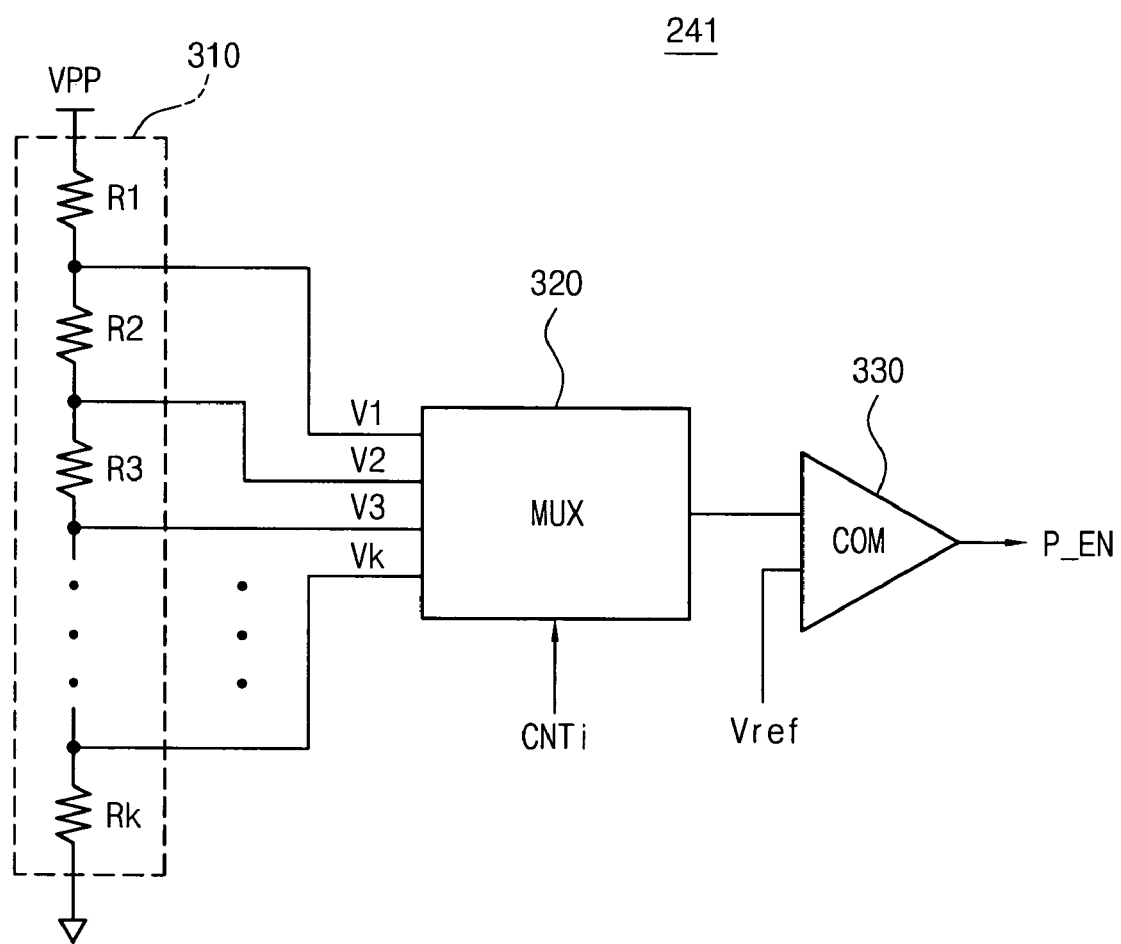
FIG. 5 is a block diagram illustrating the regulator shown in FIG. 4.

FIG. 5 is a block diagram illustrating the regulator 241 shown in FIG. 4. Referring to FIG. 5, the regulator 241 is comprised of a voltage divider 310, a selection circuit (MUX) 320, and a comparator 330. The regulator 241 receives the output voltage VPP of the charge pump 242 and generates the pump enable signal P_EN to control an operation of the charge pump 242 in response to the count signal CNTi.

The voltage divider 310 is comprised of a plurality of resistors R1, R2, R3, . . . , Rk (R1-Rk) connected between an output terminal (VPP) of the charge pump 242 and a ground terminal. The resistors R1-Rk may each set the same voltage or may each set different voltages. The voltage divider 310 generates a plurality of voltage levels V1, V2, V3, . . . , Vk (V1-Vk) by loop of voltage division.

The selection circuit 320 takes one of the plurality of voltage levels V1-Vk in response to the count signal CNTi. The selection circuit 320 selects a higher voltage level as the number of program cells increases. For example, if the number of program cells is 32, the selection circuit 320 selects the highest voltage level V1. If the number of program cells is 1, the selection circuit 320 selects the lowest voltage level Vk. The comparator 330 compares a selected voltage level with a reference voltage Vref and then generates the pump enable signal P_EN to control the charge pump 242.

The regulator 241 selects a voltage level to raise the output voltage VPP of the charge pump 242 in accordance with the number of program cells. For example, the regulator 241 adjusts the output voltage VPP of the charge pump 242 in accordance with the count signal CNTi provided from the program cell counter 230.

Figure 6A:
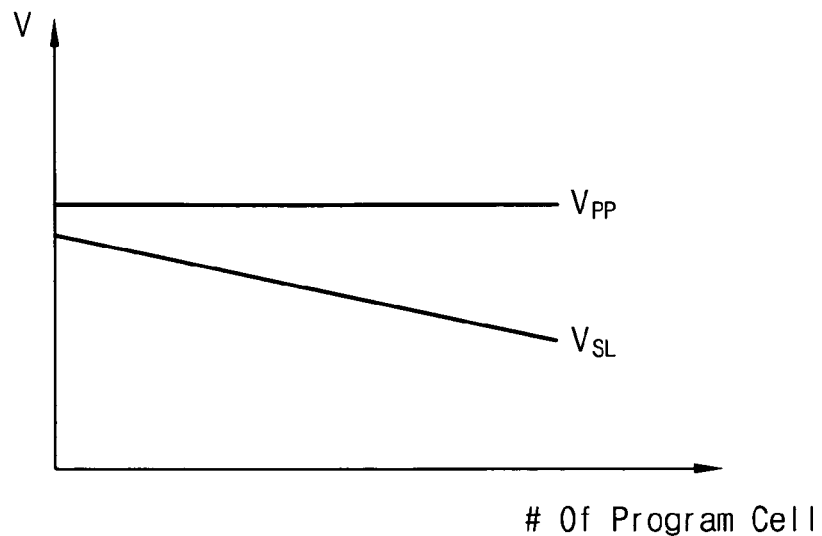
FIGS. 6A and 6B are graphic diagrams showing variations of program voltages according to the number of memory cells to be programmed.
Figure 6B:
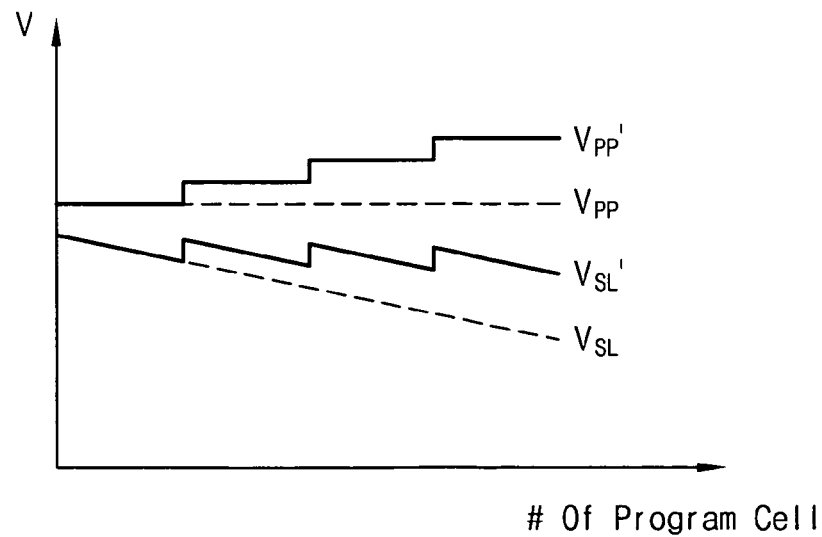

FIGS. 6A and 6B are graphs showing variations of the source line voltages VSL in accordance with the number of program cells. FIG. 6A shows variation of the source line voltage in a semiconductor memory device according to the conventional art, while FIG. 6B shows variation of the source line voltage in a semiconductor memory device according to an exemplary embodiment of the present invention.

In FIG. 6A, the output voltage VPP of the charge pump (e.g., 242 of FIG. 4) is constant regardless of the number of program cells. The source line voltage VSL decreases linearly as the number of program cells becomes larger. The difference between the output voltage VPP and the source line voltage VSL is caused by voltage drops in the driver (e.g., 243 of FIG. 4) and the source line selection circuit (e.g., 245 of FIG. 4).

If the number of program cells becomes larger, current through memory cells increases. With increasing memory cell current, voltage drops caused by the driver and source line selection circuit are also enlarged to lower the source line voltage VSL. A difference between the output voltage VPP of the charge pump and the source line voltage VSL degrades program characteristics of the semiconductor memory device, thereby deteriorating a yield of the semiconductor memory device.

In FIG. 6B, the output voltage VPP of the charge pump 242 varies according to the number of program cells. For example, as the number of program cells becomes larger, the output voltage VPP' of the charge pump 242 increases. In this case, the source line voltage VSL' is maintained without an abrupt drop although the number of program cells becomes larger. This is because the output voltage VPP' of the charge pump 242 increases along the number of program cells.

According to an exemplary embodiment of the present invention, since the source line voltage VSL does not drop abruptly even with an increase of memory cell current, acceptable program characteristics may be obtained. As such, the semiconductor memory device automatically alters the source line voltage VSL according to the number of program cells. Since it is able to adjust the source line voltage VSL with reference to the number of program cells, acceptable program characteristics may be achieved.

Semiconductor memory devices according to exemplary embodiments of the prevent invention are applicable to various electronic apparatuses such as smart cards. A smart card including a flash memory is operable with a high voltage of approximately 9V applied to the source line to program data flash memory cells. The high voltage is controlled by the regulator included in the smart card, being provided to the source line through the driver. In addition, the semiconductor memory device according to exemplary embodiments of the present invention is also applicable to a flash memory product or another system having a programming function using hot electron injection.

Semiconductor memory devices according to exemplary embodiments of the present invention are able to adjust a program voltage, which is applied to the memory cell array, in accordance with the number of program cells. The ability to control a program voltage level in accordance with the number of program cells provides acceptable program characteristics in the semiconductor memory device.

The above-disclosed subject matter is to be considered illustrative, and not restrictive, and the appended claims are intended to cover all such modifications, enhancements, and other embodiments, which fall within the true spirit and scope of the present disclosure.

What is claimed is:

1. A semiconductor memory device comprising:
   a memory cell array;
   a program voltage generator outputting a program voltage to the memory cell array, the level of the program voltage is dependent upon a number of memory cells to be programmed at the same time;
   a program cell counter calculating the number of memory cells to be programmed at the same time;
   wherein the program voltage generator comprises a voltage regulator configured to control the level of the program voltage depending upon the number of memory cells to be programmed at the same time; and
   wherein the voltage regulator controls the level of the program voltage by voltage division.

2. The semiconductor memory device as set forth in claim 1, wherein the memory cell array is programmed by hot electron injection.

3. The semiconductor memory device as set forth in claim 2, wherein the memory cell array includes a plurality of NOR flash memory cells coupled to a source line.

4. The semiconductor memory device as set forth in claim 3, wherein the plurality of NOR flash memory cells are of a split-gate type.

5. The semiconductor memory device as set forth in claim 4, wherein the program voltage is applied to the split-gate NOR flash memory cells coupled to the source line.

6. A semiconductor memory device comprising:
   a memory cell array;
   a write data buffer receiving write data in a predetermined unit;
   a program cell counter calculating an amount of data, from the write data, to be programmed in the memory cell array at the same time; and
   a program voltage generator outputting a program voltage to the memory cell array, wherein the level of the program voltage is dependent upon the amount of data to be programmed at the same time;
   wherein the program voltage generator comprises a voltage regulator controlling an operation of a charge pump depending upon the amount of data to be programmed at the same time; and a driver receiving an output voltage from the charge pump and providing the output voltage as the program voltage to the memory cell array.

7. The semiconductor memory device as set forth in claim 6, wherein the memory cell array is programmed by hot electron injection.

8. The semiconductor memory device as set forth in claim 6, wherein the memory cell array includes a plurality of NOR flash memory cells coupled to a source line.

9. The semiconductor memory device as set forth in claim 8, wherein the plurality of NOR flash memory cells are of a split-gate type.

10. The semiconductor memory device as set forth in claim 9, wherein the program voltage is applied to the split-gate NOR flash memory cells coupled to the source line.

11. The semiconductor memory device as set forth in claim 6, wherein the voltage regulator comprises:
 a voltage divider generating a plurality of voltage levels by voltage division;
 a selection circuit selecting one of the plurality of voltage levels depending upon the amount of data to be programmed; and
 a comparator comparing the selected voltage level with a reference voltage and generating a control signal to regulate the charge pump.

12. A method of programming a semiconductor memory device, comprising:
 receiving write data in a predetermined unit;
 counting the amount of data, from the write data, to be programmed in a memory cell array at the same time;
 adjusting a level of a program voltage applied to the memory cell array depending upon the amount of data to be programmed at the same time;
 controlling an operation of a charge pump depending upon the amount of data to be programmed at the same time; and
 receiving an output voltage from the charge pump and providing the output voltage as the program voltage to the memory cell array.

13. The method as set forth in claim 12, wherein the memory cell array is programmed by hot electron injection.

14. The method as set forth in claim 12, wherein the memory cell array includes a plurality of NOR flash memory cells coupled to a source line.

15. The method as set forth in claim 14, wherein the plurality of NOR flash memory cells are of a split-gate type.

16. The method as set forth in claim 14, wherein the program voltage is applied to the source line.

* * * * *